United States Patent
Hebig et al.

(10) Patent No.: US 9,335,367 B2
(45) Date of Patent: May 10, 2016

(54) IMPLEMENTING LOW TEMPERATURE WAFER TEST

(71) Applicant: International Business Machines Corporation, Armonk, NY (US)

(72) Inventors: Travis R. Hebig, Rochester, MN (US); Joseph Kuczynski, Rochester, MN (US); Steven R. Nickel, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 276 days.

(21) Appl. No.: 14/010,657

(22) Filed: Aug. 27, 2013

(65) Prior Publication Data

US 2015/0061712 A1 Mar. 5, 2015

(51) Int. Cl.
*G01R 31/28* (2006.01)

(52) U.S. Cl.
CPC ........ *G01R 31/2831* (2013.01); *G01R 31/2877* (2013.01)

(58) Field of Classification Search
CPC .. G01R 1/44; G01R 31/2831; G01R 31/2877; G01R 31/2874
USPC ............ 324/750.03, 750.08, 750.14, 754.01, 324/754.04, 754.15, 762.01
See application file for complete search history.

(56) References Cited

U.S. PATENT DOCUMENTS

| | | | |
|---|---|---|---|
| 4,757,255 A | | 7/1988 | Margozzi |
| 5,198,753 A | * | 3/1993 | Hamburgen ............. 324/750.08 |
| 5,876,686 A | * | 3/1999 | Michalczyk et al. ...... 423/592.1 |
| 6,569,695 B1 | | 5/2003 | Chen et al. |
| 7,262,610 B2 | | 8/2007 | Ohtaki |
| 7,438,631 B2 | | 10/2008 | Nagamoto et al. |
| 7,986,039 B2 | | 7/2011 | McAvoy et al. |
| 8,151,856 B2 | | 4/2012 | Kawashima et al. |
| 8,349,706 B2 | | 1/2013 | Noda |
| 2008/0054260 A1 | | 3/2008 | Ishitobi et al. |
| 2008/0163893 A1 | * | 7/2008 | Quillen et al. .................... 134/2 |
| 2009/0005842 A1 | * | 1/2009 | Lin ............................... 607/112 |

FOREIGN PATENT DOCUMENTS

| JP | 10288646 A | 10/1998 |
|---|---|---|
| JP | 2012104644 A | 5/2012 |

OTHER PUBLICATIONS

IPCOM000022694D, Mar. 25, 2004, "Protective Layer for Via Formation", Disclosed Anonymously.

* cited by examiner

*Primary Examiner* — Melissa Koval
*Assistant Examiner* — Courtney McDonnough
(74) *Attorney, Agent, or Firm* — Joan Pennington

(57) ABSTRACT

A method and structure are provided for implementing low temperature wafer testing of a completed wafer. A coolant gel is applied to the completed wafer, the gel coated wafer is cooled and one or more electrical test probes are applied through the gel to electrical contacts of the cooled wafer, and testing is performed.

20 Claims, 2 Drawing Sheets

IMPLEMENTING LOW TEMPERATURE WAFER TEST

FIELD OF THE INVENTION

The present invention relates generally to the data processing field, and more particularly, relates to a method and structure for implementing low temperature wafer testing.

DESCRIPTION OF THE RELATED ART

Current semiconductor manufacturing test flows include electrical tests of completed wafers at various temperatures to identify defective parts and to characterize parts.

Testing at extremely cold temperatures is problematic due to condensation and frost forming on the wafer which can short out exposed connections and ruin parts and the integrity of the test.

Electrical contact between the probes and the wafer is also extremely difficult to maintain in the presence of frost and freezing condensation. Customer application temperatures routinely go down to as low as −40° C. or even −55° C. for applications such as networking equipment on tall towers in Sweden or chips in satellites in space. However, testing at these temperatures is extremely difficult due to the problems of condensation and frost buildup.

A need exists to enable manufacturing wafer tests at extremely low temperatures without the negative effects of condensation and frost buildup. A need exists for an efficient and effective method for implementing low temperature wafer testing of a completed wafer.

SUMMARY OF THE INVENTION

Principal aspects of the present invention are to provide methods and structure for implementing low temperature wafer testing of a completed wafer. Other important aspects of the present invention are to provide such methods and structure substantially without negative effects and that overcome many of the disadvantages of prior art arrangements.

In brief, a method and structure are provided for implementing low temperature wafer testing of a completed wafer. A coolant gel is applied to the completed wafer, the gel coated wafer is cooled and one or more electrical test probes are applied through the gel to electrical contacts of the cooled wafer, and testing is performed.

In accordance with features of the invention, the coolant gel includes a Fluorinert® based cooling gel which is electrically insulating and extremely hydrophobic, which eliminates condensation on the electrical contacts of the completed wafer.

In accordance with features of the invention, an electrically insulating, stable fluorocarbon-based fluid and a selected polymer are blended together to provide the coolant gel. The electrically insulating, stable fluorocarbon-based fluid includes a Fluorinert® based coolant liquid. The selected polymer includes a cross-linked polyacrylic acid polymer, for example a Lubrizol Carbopol® Ultrez 10 polymer.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In accordance with features of the invention, a method and structure are provided for implementing low temperature wafer testing of a completed wafer. The method and structure of the invention enable manufacturing wafer tests at extremely low temperatures without the negative effects of condensation and frost buildup.

Figure 1:
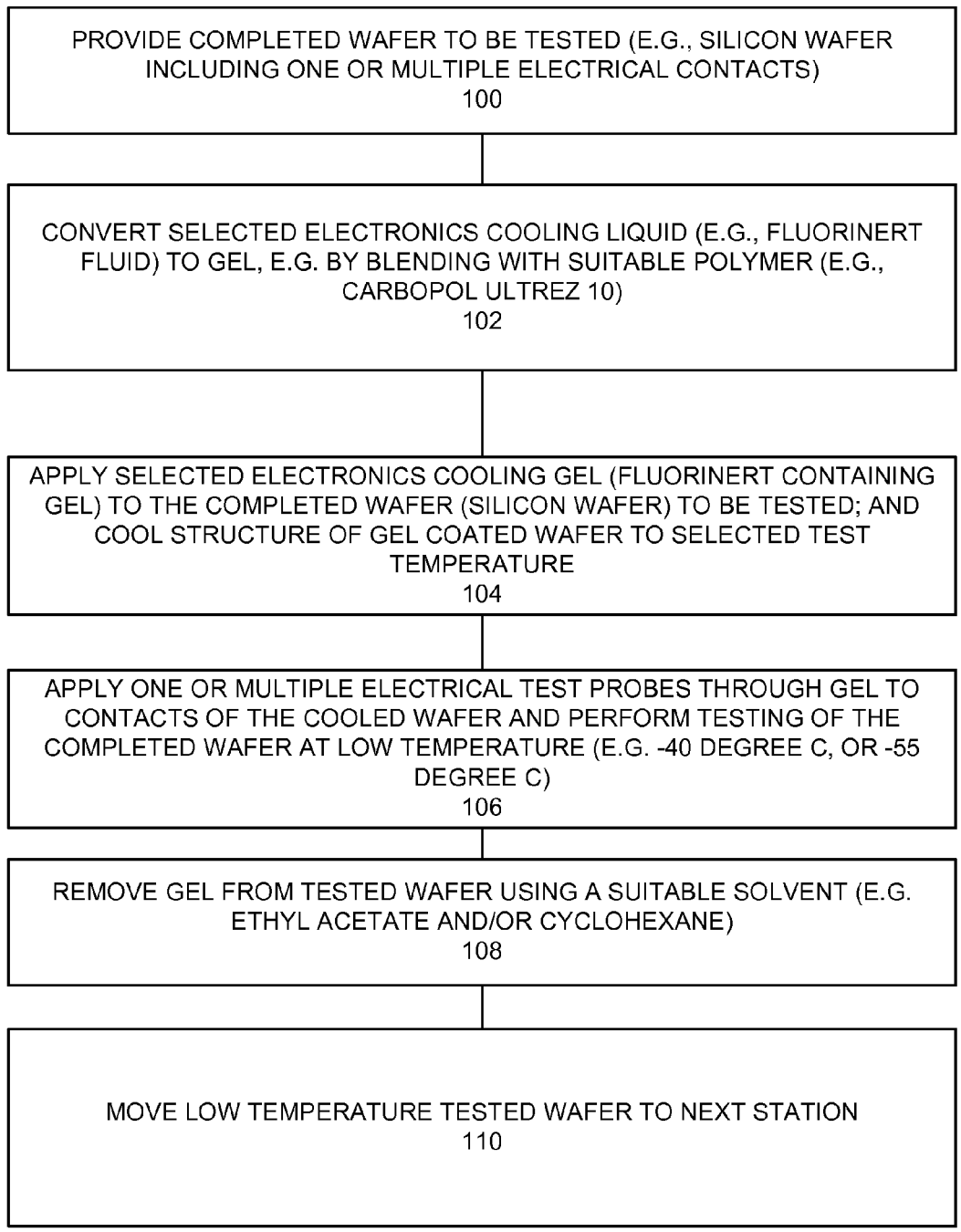
FIG. 1 is a flow chart illustrating exemplary steps for implementing low temperature wafer testing of a completed wafer in accordance with the preferred embodiment.

Having reference now to the drawings, in FIG. 1, there is shown a flow chart illustrating example steps for implementing low temperature wafer testing of a completed wafer in accordance with the preferred embodiment. As indicated in a block 100, a completed wafer is provided such as a silicon wafer including one or multiple electrical contacts.

As indicated at a block 102, a selected electronics cooling liquid is converted to a cooling gel by blending with a suitable polymer. For example, one set of materials of an electronics cooling liquid that can be used include an electrically insulating, stable fluorocarbon-based fluid including a Fluorinert® solvent, which is electrically insulating and extremely hydrophobic, and a suitable polymer, for instance, Lubrizol Carbopol® Ultrez 10, a polymer suitable for use in multiple applications, such as hand sanitizing gels. The Fluorinert® based cooling gel is electrically insulating and hydrophobic, eliminating condensation on the electrical contacts carried by the completed wafer to be tested.

In accordance with features of the invention, the use of the Fluorinert® based cooling gel enables low temperature testing, such as at −40° C. or −55° C., allowing the temperature testing to be optimized for wafer applications such as networking equipment on tall towers in Sweden or chips in satellites in space.

Fluorinert® is a trademarked brand name for a line of electronics coolant liquids sold commercially by 3M. The Fluorinert® brand of 3M fluids are traditionally used for immersion cooling of electronic products. In fact, entire electronic assemblies may be immersed in Fluorinert® without any detrimental impact to their performance. The selected polymer blended with the Fluorinert® solvent includes a cross-linked polyacrylic acid polymer, for example a Lubrizol Carbopol® Ultrez 10 polymer. A desired loading level of the Fluorinert® fluid in the Carbopol® polymer is easily determined experimentally for a particular low temperature wafer testing application.

As indicated in a block 104, the selected electronics cooling gel, such as the Fluorinert® containing gel is applied to the completed wafer, such as a silicon wafer to be tested; and the structure of the wafer with the cooling gel layer is cooled to a selected test temperature, such as −40° C. or −55° C.

As indicated in a block 106, one or multiple electrical test probes are applied through the cooling gel layer to selected electrical contacts on the completed wafer, and low temperature testing of the wafer is performed at temperatures such as −40° C. or −55° C.

As indicated in a block 108, after testing is performed, the cooling gel layer is removed from the tested wafer using a suitable solvent, for example, ethyl acetate and/or cyclohexane solvent.

As indicated in a block 110, the low temperature tested wafer is then moved to a next station.

In accordance with features of the invention, the use of the testing method of FIG. 1 provides benefits over conventional testing by immersing an entire tester chuck/test head in Fluorinert® including that the test equipment costs are lower, the test process is simpler, and the test procedure is less expensive. Finally, use of this cooling gel enables low-temperature testing which is currently extremely problematic.

Figure 2:
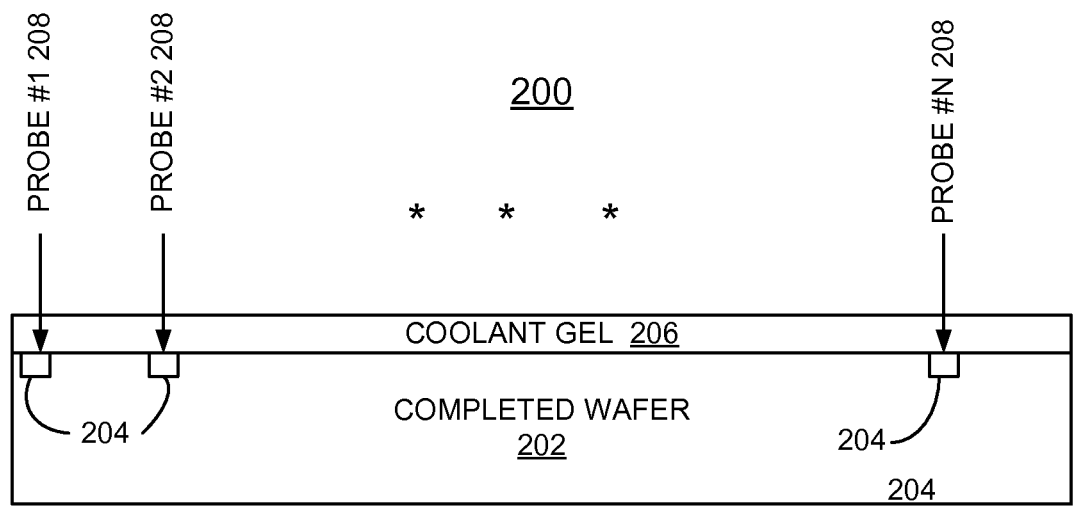
FIG. 2 illustrates a structure for implementing low temperature wafer testing of a completed wafer in accordance with a preferred embodiment.

Referring also to the data of FIG. 2, there is shown a structure designated by the reference character 200 in accordance with the preferred embodiment. As shown, structure 200 includes a completed wafer 202 that includes a plurality of electrical contacts 204, and a coolant gel layer 206. A selected plurality of electrical test probes 208, #1-N are applied through the cooling gel layer 206 to selected electrical contacts 204 on the completed wafer 202 for low temperature testing of the wafer.

It should be understood that the present invention is not limited to use of the example Fluorinert® based cooling gel, other electrically insulating and hydrophobic based cooling gels may be chosen by those skilled in the art.

While the present invention has been described with reference to the details of the embodiments of the invention shown in the drawing, these details are not intended to limit the scope of the invention as claimed in the appended claims.

What is claimed is:

1. A method for implementing low temperature wafer testing of a completed wafer comprising:
    applying a coolant gel to the completed wafer, said coolant gel being electrically insulating and hydrophobic;
    cooling the gel coated wafer in a temperature range including −40° C. or −55° C.;
    applying one or more electrical test probes through the gel to electrical contacts of the cooled wafer, said coolant gel eliminating condensation on the electrical contacts, and performing testing of the cooled wafer.

2. The method as recited in claim 1 wherein applying a coolant gel to the completed wafer includes blending an electrically insulating, stable fluorocarbon-based fluid and a selected polymer to provide said coolant gel.

3. The method as recited in claim 2 wherein said electrically insulating, stable fluorocarbon-based fluid includes a Fluorinert® based coolant liquid.

4. The method as recited in claim 2 wherein said selected polymer includes a cross-linked polyacrylic acid polymer.

5. The method as recited in claim 4 wherein said selected polymer includes a Carbopol® Ultrez 10 polymer.

6. The method as recited in claim 1 includes removing said coolant gel from the tested wafer.

7. The method as recited in claim 6 wherein removing said coolant gel from the tested wafer includes applying a selected solvent to said coolant gel.

8. The method as recited in claim 7 wherein applying a selected solvent includes applying an ethyl acetate solvent to said coolant gel.

9. A structure for implementing low temperature wafer testing of a completed wafer comprising:
    one or more electrical contacts carried by the completed wafer;
    a selected coolant gel layer carried by the completed wafer, said coolant gel being electrically insulating and hydrophobic; said completed wafer with said selected coolant gel layer being cooled to a selected low temperature in a temperature range including −40° C. or −55° C.;
    one or more electrical test probes applied through the gel to connect with said electrical contacts of the cooled wafer for performing testing of the cooled wafer, said coolant gel eliminating condensation on the electrical contacts.

10. The structure as recited in claim 9 wherein said selected coolant gel layer applied to the completed wafer includes an electrically insulating, stable fluorocarbon-based fluid blended with a selected polymer to provide said coolant gel layer.

11. The structure as recited in claim 10 wherein said an electrically insulating, stable fluorocarbon-based fluid includes a Fluorinert® based coolant liquid.

12. The structure as recited in claim 10 wherein said selected polymer includes a cross-linked polyacrylic acid polymer.

13. The structure as recited in claim 10 wherein said selected polymer includes a Carbopol® Ultrez 10 polymer.

14. The structure as recited in claim 10 wherein said selected coolant gel layer is removed from the completed wafer after testing of the cooled wafer.

15. The structure as recited in claim 14 includes a selected solvent applied to said coolant gel for removing said selected coolant gel layer from the completed wafer after testing of the cooled wafer; said selected solvent including an ethyl acetate solvent.

16. A method for implementing low temperature wafer testing of a completed wafer comprising:
    blending an electrically insulating, stable fluorocarbon-based fluid and a selected polymer to provide a coolant gel;
    applying said coolant gel to the completed wafer, said coolant gel being electrically insulating and hydrophobic;
    cooling the gel coated wafer in a temperature range including −40° C. or −55° C.;
    applying one or more electrical test probes through the gel to electrical contacts of the cooled wafer, said coolant gel eliminating condensation on the electrical contacts, and performing testing of the cooled wafer.

17. The method as recited in claim 16 wherein said electrically insulating, stable fluorocarbon-based fluid includes a Fluorinert® based coolant liquid.

18. The method as recited in claim 16 wherein said selected polymer includes a Carbopol® Ultrez 10 polymer.

19. The method as recited in claim 16 includes removing said coolant gel from the tested wafer by applying a selected solvent to said coolant gel.

20. The method as recited in claim 19 wherein applying a selected solvent includes applying an ethyl acetate solvent to said coolant gel.

* * * * *